United States Patent [19]
Koifman et al.

[11] Patent Number: 5,907,589
[45] Date of Patent: May 25, 1999

[54] GHZ RANGE FREQUENCY DIVIDER IN CMOS

[75] Inventors: Vladimir Koifman, Rishon Le Zion; Yachin Afek, Kfar Saba, both of Israel

[73] Assignee: Motorola, Inc., Schaumburg, Ill.

[21] Appl. No.: 08/838,592

[22] Filed: Apr. 10, 1997

[51] Int. Cl.[6] .............................................. H03K 21/00
[52] U.S. Cl. .......................... 377/47; 327/202; 327/203; 327/115; 327/117
[58] Field of Search ................... 377/47, 48, 115–117; 327/202–3, 117, 118

[56] References Cited

U.S. PATENT DOCUMENTS

| | | | |
|---|---|---|---|
| 4,395,774 | 7/1983 | Rapp . | |
| 4,845,727 | 7/1989 | Murray | 377/104 |
| 5,175,752 | 12/1992 | Yokomizo . | |
| 5,570,051 | 10/1996 | Chiang et al. | 327/407 |
| 5,751,665 | 5/1998 | Tanoi | 327/295 |

FOREIGN PATENT DOCUMENTS

| | | | |
|---|---|---|---|
| 0086671 | 8/1983 | European Pat. Off. | H03K 17/22 |
| 5347554 | 12/1993 | Japan | H03K 23/64 |

OTHER PUBLICATIONS

Jan Craninckx and Michiel S.J. Steyaert, "A 1.75 GHz/3–V Dual Modulus divide–by–128/129 Prescaler in 0.7βm CMOS" in IEEE Journal of solid–state circuits, vol. 31, No. 7, Jul. 1996, pp. 890–897.

Navid Foroudi and Tadeusz A. Kwasniewski, "CMOS High– Speed dual–modulus Frequency didvider for RF Frequency Synthesis" in IEEE Journal of solid–state circuits, vol. 30, No. 2, Feb. 1995, pp. 93–100.

R. Rogenmoser, Q. Huang, F. Piazza, "1.57 GHZ Asynchronous and 1.4 GHZ Dual–Modulus 1.2βm CMOS prescalers" in IEEE 1994 Custom integrated circuits conference, pp. 387–390.

R. Rogenmoser, N. Felber, Q. Huang and W. Fichtner, "1.16 GHZ Dual–Modulus 1.2βm CMOS prescaler" in IEEE 1993 custom integrated circuits conference, pp. 27.6.1–27.6.4.

*Primary Examiner*—Margaret Rose Wambach

[57] ABSTRACT

A frequency divider (50) comprises complementary components (e.g., CMOS transistors) which are placed in two complementary portions (10, 20) with similar structures. The portions are coupled by four lines (131–134). Each line (e.g., 131) is coupled to a pair of transistors including a pull device (e.g., 271) and a hold device (e.g., 291). The devices receives identical signals from another line (e.g., 134) and the input signal X in the same, non-inverted form. The devices have complementary logical functions because of their complementary structures (serial\parallel) and complementary components (P-FET, N-FET). When a line (e.g., 131) is pulled to a reference line (e.g., 91), contention between the devices is substantially avoided. There is no need to provide the input signal X in a non-inverted and in an inverted form.

12 Claims, 5 Drawing Sheets

1
GHZ RANGE FREQUENCY DIVIDER IN CMOS

FIELD OF THE INVENTION

This invention relates to frequency dividers, especially to frequency dividers implemented in technology suitable for operation at high frequencies.

BACKGROUND OF THE INVENTION

Frequency dividers receive an input signal X of the input frequency $f_X$ and generate an output signal Y of the output frequency $f_Y=f_X/N$, most of them with an integer division ratio N. Usually, frequency dividers are implemented as T-flip-flops or blocks with digital logic elements, such as inverters, AND-gates, OR-gates, transfer gates and the like. Such logic elements inherently exhibit delay. For example, an inverter transfer signals with a delay time $t_D$. If $t_D$ is significantly shorter than the binary states change of an incoming signal (e.g., $t_D<1/f_X$), than $t_D$ can be neglected. However, if $t_D$ is in the range of the input signal X (e.g., $t_D\sim1/f_X$), the output signal Y can come too late and can be unreliable.

The delay time $t_D$ and therefore the speed of any frequency divider is influenced by many factors, such as, for example, the carrier flight time, the charging time of capacities, propagation delay, and contention. The speed depends therefore on the manufacturing technology and on the circuit design. For example, the speed of a present day CMOS frequency divider using a T-flip-flop is limited to about $f_X=500-600$ MHz. For higher frequencies, other technologies, such as, e.g., BiCMOS or ECL are often used. For modern telecom applications, there is the need to integrate frequency dividers into CMOS signal processing chips. To save costs, the frequency divider should be designed in the same technology as the rest of the chip and additional manufacturing steps should be avoided.

Examples of prior art approaches are described in:
[1] U.S. Pat. No. 5,175,752—Yokomizo;
[2] Published Application JP-5-347554—Mon;
[3] Craninckx et. al.: A 1.75 GHz/3V Dual-Modulus Divide-by-128/129 Prescaler in 0.7-μm CMOS, IEEE Journal of Solid-State Circuits, V.31, No.7, July 1996;
[4] Rogenmoser, R., et. al.: A 1.16 GHz dual modulus 1.2-μm CMOS prescaler, Proc. IEEE 1993 Custom Integrated Circuits Conf., San Diego, May 1993, pp. 27.6.1–4;
[5] Foroudi, N., and Kwasniewski, T.: CMOS High-Speed Dual-Modus Frequency Divider for RF Frequency Synthesis, IEEE Journal of Solid-State Circuits, v. 30, No. 2, 02/1995; and
[6] Rogenmoser, R., et. al.: 1.57 GHz Asynchronous and 1.4 GHz Dual-Modulus 1.2-μm CMOS prescalers, IEEE 1994 Custom Integrated Circuits conference.

FIG. 1 shows a master-slave arrangement of prior art frequency divider 99 (hereinafter T-FF 99). FIG. 1 is a combination of FIGS. 1A–B of reference [2]. T-FF 99 has a master side (in FIG. 1 left) and a slave side (right) which receive input signal X and inverted input signal X̲. The underlining of the symbol indicates the inversion. On the master side, the input of inverter 1 is coupled to the output of inverter 2 (inverted outputs are denoted with a circle). The output of inverter 2 is coupled to the input of inverter 1. PMOS 3 is coupled between the input of inverter 1 and high supply line VDD. PMOS 3 is gated by input signal X. NMOS 4 and NMOS 6 are serially coupled between input of inverter 1 and low supply line VSS. NMOS 6 is gated by inverted input signal X̲. NMOS 4 is gated by signal Q̲ from

2 the slave side. PMOS 9 is coupled between the input of inverter 2 and high supply line VDD. PMOS 9 is gated by input signal X. NMOS 8 is coupled between input of inverter 2 and NMOS 6. NMOS 8 is gated by signal Q from the slave side. On the slave side (FIG. 1 right), the inputs and outputs of inverter 10 and inverter 11 are cross-coupled. PMOS 12 is coupled between in input of inverter 10 and high supply line VDD. PMOS 12 is gated by inverted input signal X̲. NMOS 13 and NMOS 16 are serially coupled between the input of inverter 10 and low supply line VSS. NMOS 16 is gated by input signal X. The gate of NMOS 13 is coupled to the output of inverter 2 of the master side. PMOS 14 is coupled between the input of inverter 11 and high supply line VDD. PMOS 14 is gated by inverted input signal X̲. NMOS 15 is coupled between output of inverter 10 and NMOS 16 and gated by the output of inverter 1 of the master side.

Signals Q and Q̲ (inverted Q) are available at the inputs of inverter 10 and 11, respectively. T-FF 99 divides the input frequency $f_X$ of input signal X to output frequency $f_Y$ of signals Q and Q̲ by N=2: that is $f_Y=f_X/2$. It is a drawback of prior art T-FF 99 that the input signal is supplied in a not-inverted (X) and in an inverted form (X̲). The inverter which is required to obtain X̲ causes a delay limiting the maximum input frequency $f_X$.

Reference [4] shows a dynamic frequency divider circuit having a true-single phase clock input (see [4], FIGS. 2A–B). The frequency divider of reference [3] is a master-slave arrangement in a standard ECL-D-flip-flops arrangement which was implemented in CMOS (see [3], FIGS. 6A–B). Both the master and the slave receive the input signal and the inverted input signal. The frequency divider in [1] comprises a D-type flip-flop receiving the input signal, a D-type flip-flop receiving the inverted input signal and an additional gating circuit at the output to speed up operation. The frequency dividers known in the art required either an inverted clock input or a full swing input signal for operation.

Accordingly, there is an ongoing need to provide an improved frequency divider and method which overcomes some or all of the deficiencies of the prior art.

DETAILED DESCRIPTION OF THE DRAWINGS

The frequency divider of the present invention comprises complementary components (e.g., transistors) which are placed in substantially similar structures (e.g., portions, arrangements). This duality will be expressed by term pairs such as, for example, 'odd-even', 'first type-second type', 'first and second transition', 'P-FET and N-FET'. There is no need to provide an input signal in a non-inverted and inverted form, that is only X is needed and $\underline{X}$ is not needed.

Figure 1:
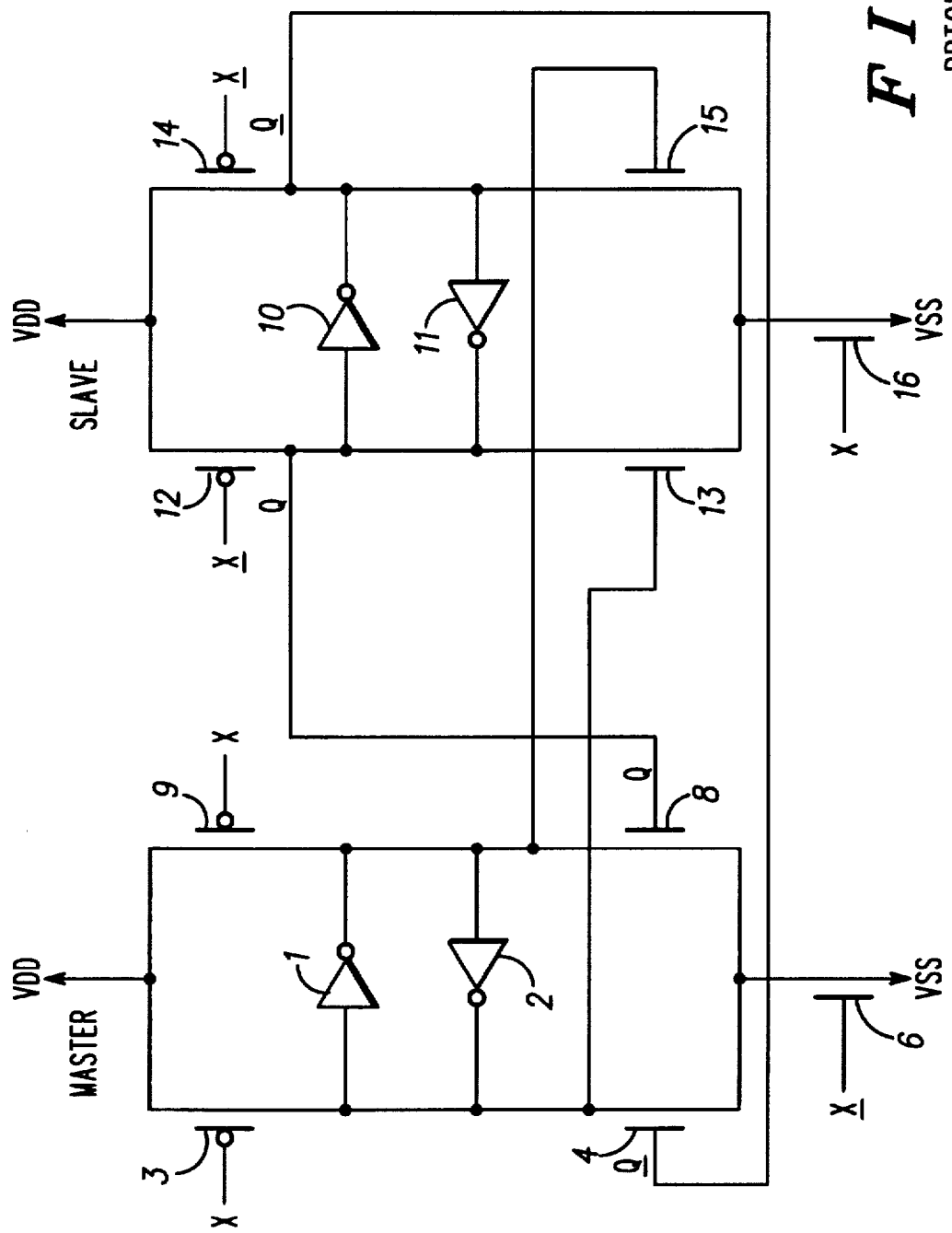
FIG. 1 shows a master-slave arrangement of a prior art frequency divider (T-flip-flop)
Figure 2:
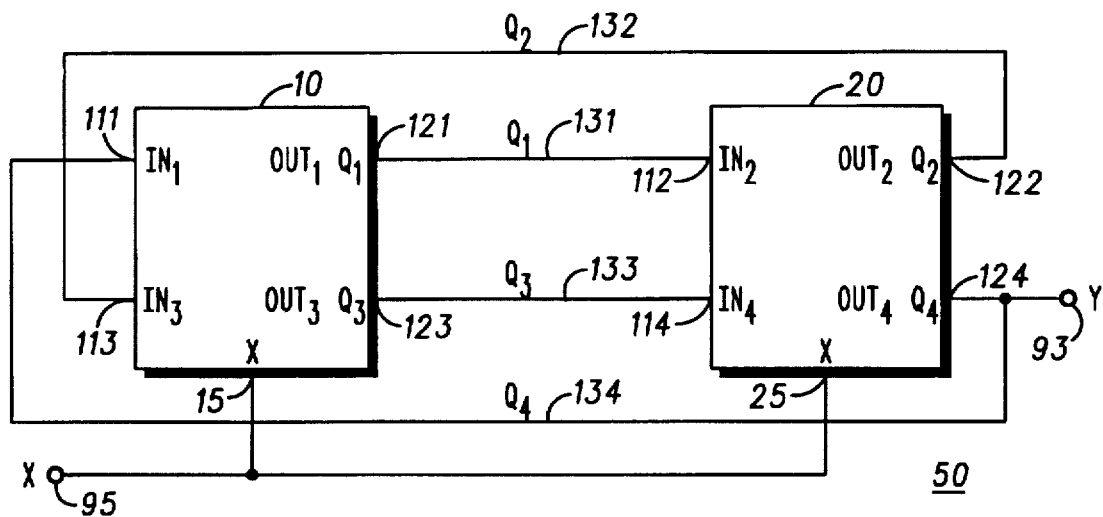
FIG. 2 shows a simplified block diagram of a frequency divider according to the present invention.

FIG. 2 is a simplified block diagram of frequency divider 50 according to the invention. Frequency divider 50 comprises at least first portion 10 and second portion 20. Input terminal 95 of frequency divider 50 is coupled to control input 15 of first portion 10 and to control input 25 of second portion 20.

Other reference numbers (e.g., 131) in FIG. 2 and in other figures have three digits. A plurality of at least M=4 (I=1, 2, 3 ... M) is introduced for inputs $IN_I$, outputs $OUT_I$, lines, and signals $Q_I$ which are functionally related by a preferred signal flow. The plurality M is expressed by the terms 'first', 'second', 'third', and 'fourth' or by the indices 'I'. Indices can be combined with integers to produce cyclic sums where only the values 1 to M are allowed (e.g., I+1, I+2, I-1). For example where M=4, then in case a sum 3+2=5 becomes 5-M=1, and 1-1=0 becomes M=4 and so forth). It is convenient for explanation to classify the plurality M into 'even' and 'odd'. The term 'even' is used for even indices (I=2, 4, etc.) and even three-digit reference numbers (e.g., 112). The term 'odd' is used for odd indices (I=1, 3, etc.) and for odd three-digit reference numbers (e.g., 111). The terms 'even' and 'odd' are also used for components and signals with even or odd indices and reference numbers. In general, even indices I are indices 'E' and odd indices I are indices 'O'. This classification is valid for all components and signals as they will be described herein. As used herein, the right-most digit of three-digit reference numbers can be replaced by 'I', 'M', 'E', 'O' or N (e.g., 171 for 171, 172, etc.).

First portion 10 has first input 111 (hereinafter $IN_1$), first output 121 (hereinafter $OUT_1$), third input 113 ($IN_3$), and third output 123 ($OUT_3$). Second portion 20 has second input 112 ($IN_2$), second output 122 ($OUT_2$), fourth input 114 ($IN_4$), and fourth output 124 ($OUT_4$). First line 131 couples $OUT_1$ to $IN_2$. Second line 132 couples $OUT_2$ to $IN_3$. Third line 133 couples $OUT_3$ to $IN_4$. Fourth line 134 couples $OUT_4$ to $IN_1$.

Signals are: input signal X at input terminal 95, output signal Y at output terminal 93, and intermediate signals $Q_1$, $Q_2$, $Q_3$, and $Q_4$ (collectively $Q_I$) at lines 131, 132, 133, and 134, respectively. Output signal Y can be any of intermediate signals $Q_I$. In frequency divider 50, output terminal 93 is coupled to fourth output 124 ($OUT_4$) and output signal Y is identical to $Q_4$. This is convenient, but not essential. Output terminal 93 can also be coupled to $OUT_1$, $OUT_2$, or $OUT_3$.

Signals X, $Q_I$, and Y are binary signals and alternate between a first logical state and a second logical state. It is defined for convenience of explanation, that the term 'first transition' indicates changes of any signal from the first logical state to the second logical state (changes in a first direction). 'Second transition' stands for changes in the second, opposite direction from the second logical state to the first logical state. In the following explanation, the first logical state will be abbreviated by logical "1" and the second state will be abbreviated by logical "0". Also, logical "1" is expressed by "high" signal levels and logical "0" is expressed by "low" signals levels. This is a convenient assumption for explanation, but not a requirement for the invention. The terms "fall" or "falling" ("1" to "0") are used as synonyms for the first transition. The terms "rise" or "rising" ("0" to "1") are used for the second transition. The term "toggle" is used for signals $Q_1$, $Q_2$, $Q_3$ and $Q_4$ when they change from logical "0" to "1" or vice versa. The input frequency (or first frequency) $f_X$ of X is divided by division ratio N (e.g., N=2) into the output frequency (or second frequency) $f_Y = f_X/N$ of Y.

The logical functions of first portion 10 and second portion 20 can be described by the following rules:

(1) Rising input signal X (first transition, "0" to "1") enables second portion 20 and disables first portion 10.

(2) Falling input signal X (second transition, "1" to "0") enables first portion 10 and disables second portion 20.

(3) For enabled portions:
  (a) Signal $Q_{I-1}$ at $IN_I$ is inverted to signal $Q_I = NEG(Q_{I-1})$ at $OUT_I$ ('NEG' for inversion).
  (b) Signal $Q_I$ at output $OUT_I$ causes the inversion of signal $Q_{I+2}$ at output $OUT_{I+2}$.

(4) For disabled portions, signal $Q_I$ at $OUT_I$ and $Q_{I+2}$ at $OUT_{I+2}$ remain unchanged. That means, that the outputs are latched.

(5) The signals at the output of each portion are inverted. For example, $Q_3$ is inverted compared to $Q_1$ (first portion 10) and $Q_4$ is inverted compared to $Q_2$ (second portion 20) This rule implies that the signals at the inputs ($IN_I$, $IN_{I+2}$) are also inverted.

Signals $Q_I$ define four cyclical states of frequency divider 50. This states are characterized by uppercase letters 'A, B, C, D'. Preferably, state transitions occur in the order AB, BC, CD, and DA. This assumption is convenient for explanation but not necessary for the invention. It is possible to invert signals and logical states without departing from the scope of the invention.

Figure 3:
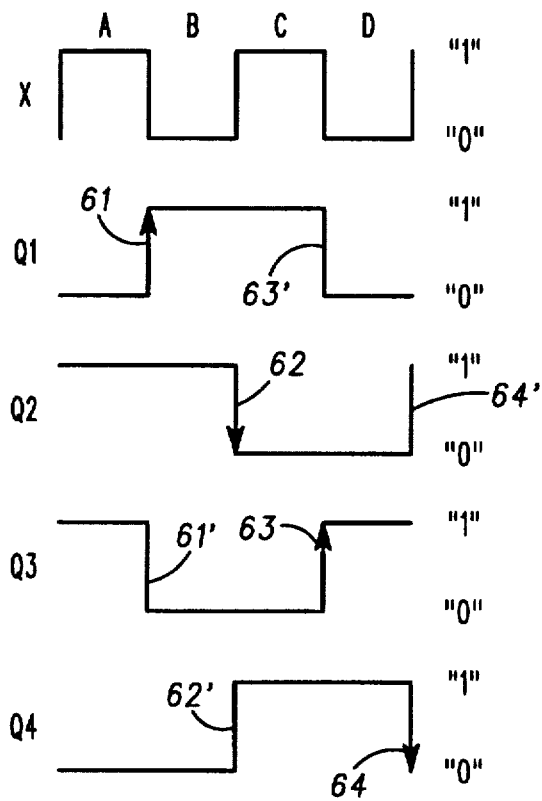
FIG. 3 shows a simplified time-state diagram of the frequency divider of FIG. 2.

A method for operating frequency divider 50 of the present invention is illustrated in FIG. 3. FIG. 3 is a simplified time-state diagram of signals X, $Q_1$, $Q_2$, $Q_3$ and $Q_4$. For convenience, logical states A, B, C, and D of frequency divider 50 are given at the top of the figure. For simplicity, signals are shown having a rectangular shape. The signals alternate (toggle) between logical "1" and logical "0". Traces 61, 62, 63, 64 indicate the toggling of signals $Q_1$, $Q_2$, $Q_3$, and $Q_4$, respectively, which is caused by a negation of signals from inputs $IN_I$. (see rule 3(a)). Primed traces 61', 62', 63', and 64' indicate toggling of $Q_{I+2}$ caused by changes at outputs $OUT_I$ (see rule 3(b)). Toggling shown by primed traces (e.g., 61') occurs slightly after toggling shown by unprimed traces (e.g., 61) depending on the switching time of the transistors involved.

The method is cyclic so that frequency divider 50 can start and stop at any of the states A, B, C or D. For explanation, it is assumed that in state A, the signals have the following logical states: X="1", $Q_1$="0", $Q_2$="1", $Q_3$="1", and $Q_4$="0".

In step 1, (transition AB) input signal X falls to logical "0". X enables first portion 10 and disables second portion 20. First portion 10 receives $Q_4$="0" at $IN_1$ and inverts it to $Q_1$="1" at $OUT_1$ (trace 61). Also, $Q_1$="1" causes $Q_3$ to toggle to $Q_3$="0" (trace 61'). Signals $Q_2$ and $Q_4$ of second portion 20 remain unchanged.

In step 2, (transition BC) input signal rises to logical "1". X enables second portion 20 and disables first portion 10. Second portion 20 receives $Q_1$="1" at $IN_2$ and inverts it to $Q_2$="0" at $OUT_2$ (trace 62). Also, $Q_2$="0" causes $Q_4$ to toggle to $Q_4$="1" (trace 62'). Signals $Q_1$ and $Q_3$ of first portion 10 remain unchanged.

In step 3, (transition CD) input signal X falls to logical "0". X enables first portion 10 and disables second portion 20. First portion 10 receives $Q_2$="0" at $IN_3$ and inverts it to $Q_3$="1" at $OUT_3$ (trace 63). Also, $Q_3$="1" causes $Q_1$ to toggle to $Q_1$="0" (trace 63'). Signals $Q_2$ and $Q_4$ of second portion 20 remain unchanged.

In step 4, (transition DA) input signal rises to logical "1". X enables second portion 20 and disables first portion 10. Second portion 20 receives $Q_3$="1" at $IN_4$ and inverts it to $Q_4$="0" at $OUT_4$ (trace 64). Also, $Q_4$="0" causes $Q_2$ to toggle to $Q_2$="1" (trace 64'). Signals $Q_1$ and $Q_3$ of first portion 10 remain unchanged. The cycle (steps 1–4) can now be repeated. X alternates at frequency $f_X$ and intermediate signals $Q_I$ alternate at the frequency $f_Y = f_X/2$.

For further explanations, it is convenient to define the term 'active signals'. An intermediate signal $Q_1$, $Q_2$, $Q_4$, or $Q_4$ originating form one portion is active when it invokes the toggling of the other portion. Thereby, active signals themselves do not toggle. In other words, active signals are circulating through frequency divider 50. The active signals are "0", then "1", again at "0" and so on. First portion 10 and second portion 20 have inverse logical functions. First portion 10 is switched by active signals at logical "0" ($Q_2$="0", $Q_4$="0") and supplies active signals at logical "1" ($Q_1$="1", $Q_3$="1"). Second portion 20 is switched by active signals at logical "1" ($Q_1$="1", $Q_3$="1") and supplies active signals at logical "0" ($Q_2$="0", $Q_4$="0"). First portion 10 switches at falling edges, and second portion 20 switches at rising edges of X.

Figure 4:
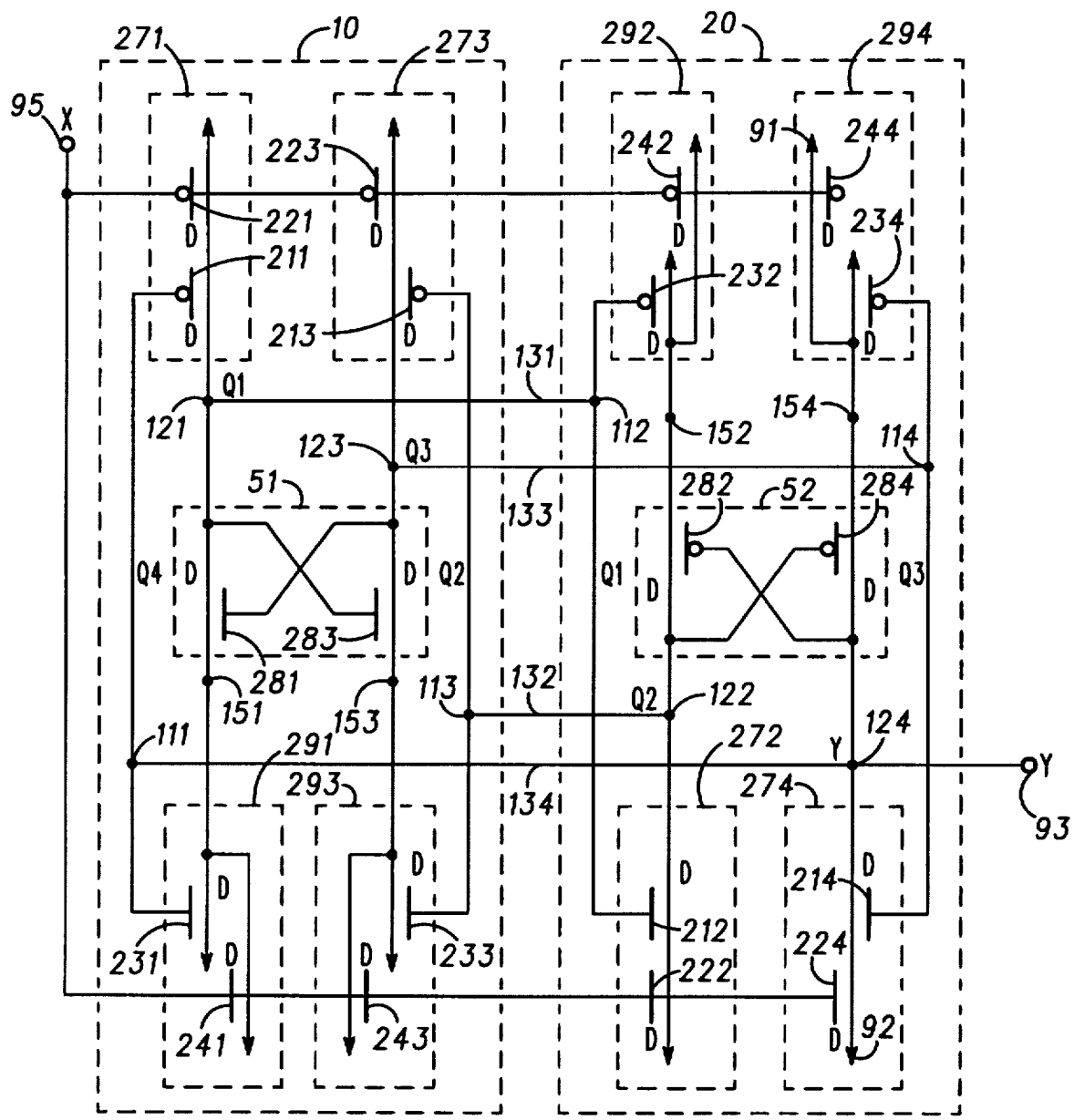
FIG. 4 shows a schematic circuit diagram of the frequency divider of FIG. 2 in a preferred embodiment of the invention.

FIG. 4 shows a schematic circuit diagram of frequency divider 50 in a first embodiment of the invention. Various modifications can be done by a person skilled in the art without departing from the scope of the invention. Two-digit reference numbers correspond to FIG. 2 indicating first portion 10 and second portion 20, input terminal 95, and output terminal 93. Portions 10 and 20 are enclosed by dashed lines.

Three-digit reference numbers 1xx correspond to FIG. 2, such as for lines 131, 132, 133, and 134. Inputs 111, 112, 113 and 114 of FIG. 2 are nodes 111, 112, 113, and 114 in FIG. 4. Outputs 121, 122, 123 and 124 in FIG. 2 are first node 121, second node 122, third node 123, and fourth node 124 in FIG. 4.

Preferably, frequency divider 50 comprises N-channel field effect transistors (N-FETs) 214, 224, 212, 222, 231, 233, 241, 243, 281, and 283 and P-channel field effect transistors (P-FETs) 211, 213, 221, 223, 232, 234, 244, 242, 282, 284. This is convenient, but not essential for the invention. N-FETs and P-FETs can be replaced by other complementary devices having main electrodes (e.g., sources, drains) and control electrodes (e.g., gates), such as, for example, bipolar transistors. In general, P-FETs stand for transistors of a first type and N-FETs stand for transistors of a second, opposite type. In FIG. 4, the drains of P-FETs and N-FETs are marked with the letter symbol 'D'. P-FETs are symbolized by a circle at the gate. The drains (D) and the sources (S) of the FETs will be distinguished in the explanation.

In FIG. 4, connections to first reference line 91 and to second reference line 92 are indicated by arrows pointing up or pointing down, respectively. Preferably, the voltage (e.g., $V_{DD}$=5 volts) of first reference line 91 substantially corresponds to logical "1" of the signals. The voltage (e.g., $V_{SS}$=0 volts) of second reference line 92 substantially corresponds to logical "0". The term 'first level' is used to collectively describe the first logical state of signals (e.g., "1"), first reference line 91 or a voltage at first reference line 91. Analogously, the term 'second level' describes the second logical state of signals ("0"), second reference line 92 or its voltage. Persons of skill in the art will understand based on the explanation herein that other logical and voltage levels can also be used. Only for the purpose of explanation it is assumed that the signals are rectangular. The terms 'up' and 'down' as used herein in connection with the terms 'pull' and 'hold', are convenient abbreviations indicating the direction of change with respect to first reference line 91 which is drawn at the top of FIGS. 4–5 and the direction of change with respect to second reference line 92 drawn at the bottom. As far as the absolute direction is concerned this is not essential and the terms 'up' and 'down' can be considered to merely indicate opposite directions.

Control inputs 15 and 25 of FIG. 2 correspond to the gates of P-FETs 221, 223, 242, 244 and of N-FETs 222, 224, 241, and 243. As in FIG. 2, first portion 10 and second portion 20 are coupled by four lines 131, 132, 133, and 134 between nodes 121/112, 122/113, 123/114, and 124/111, respectively. By these lines, first portion 10 monitors nodes 122 and 124 of second portion 20; and second portion 20 monitors nodes 121 and 123 of first portion. Each portion knows the state of the other portion. First portion 10 (left side of FIG. 4) comprises P-FETs 211, 213, 221, and 223 and N-FETs 231, 233, 241, 243, 281, and 283. The FETs can be grouped into functional devices (271, 273, 291, 293) shown dashed. Serially arranged P-FETs 211 and 221 form first pull device 271. Serially arranged P-FETs 213 and 223 form third pull device 273. Pull devices 271 and 273 form a means for pulling up node 121 and node 123 alternatively to the first level. Cross coupled N-FETs 281 and 283 form RS-type flip-flop 51. Flip-flop 51 is a means for keeping node 121 and node 123 at the first level. Parallel arranged N-FETs 231, 241 and 233, 243 form first hold device 291 and third hold device 293, respectively.

In flip-flop 51, the drain of N-FET 281 is coupled to node 121 and to the gate of N-FET 283. The drain of N-FET 283 is coupled to node 123 and to the gate of N-FET 281. This is a structure of two cross-coupled inverters.

In pull device 271, the source-drain (S-D) paths of P-FETs 221 and 211 are serially coupled between first reference line 91 and node 121. The gate of P-FET 221 is coupled to input terminal 95 for receiving input signal X. The gate of P-FET 211 is coupled to line 134 for receiving signal $Q_4$. In pull device 273, the S-D paths of P-FETs 223 and 213 are serially coupled between first reference line 91 and node 123. The gate of P-FET 223 is coupled to input terminal 95 for receiving X and the gate of P-FET 213 is coupled to line 132 for receiving $Q_2$. The means for pulling nodes (devices 271 and 273) is coupled to the first level.

It is convenient for further explanation to introduce point 151 at the source of N-FET 281 and point 153 at the source of N-FET 283. In hold device 291, the D-S paths of N-FET 231 and of N-FET 241 are coupled between the source of N-FET 281 (point 151) and second reference line 92. The gate of N-FET 241 is coupled to input terminal 95 for receiving X. The gate of N-FET 231 is coupled to line 134 for receiving $Q_4$. In hold-down device 292, the D-S paths of N-FET 233 and N-FET 243 are coupled between the source of N-FET 283 (point 153) and second reference line 92. The gate of N-FET 243 is coupled to input terminal 95 for receiving X. The gate of N-FET 233 is coupled to line 132 for receiving $Q_2$.

Now, second portion 20 (right side of FIG. 4) is explained in detail. Second portion 20 comprises N-FETs 212, 214, 222 and 224 and P-FETs 232, 234, 242, 244, 282, and 284. The FETs can be grouped into functional devices (272, 274, 293, 294) shown dashed. Serially arranged N-FETs 212 and 222 form second pull device 272. Serially arranged N-FETs 214 and 224 form fourth pull device 274. Pull devices 272 and 274 form a means for pulling node 122 and node 124 alternatively to the second level. Cross coupled P-FETs 282 and 284 form RS-type flip-flop 52. Flip-flop 52 is a means for keeping node 122 and node 124 at the second level. Parallel arranged P-FETs 234, 242 and 234, 244 form hold devices 292 and 294, respectively. In flip-flop 52, the drain of P-FET 284 is coupled to node 124 and to the gate of P-FET 282. The drain of P-FET 282 is coupled to node 122 and to the gate of P-FET 284. This is a structure of two cross-coupled inverters.

In pull device 274, the source-drain (S-D) paths of N-FETs 224 and 214 are serially coupled between second reference line 92 and node 124. The gate of N-FET 224 is coupled to input terminal 95 for receiving input signal X. The gate of N-FET 214 is coupled to line 133 for receiving signal $Q_3$. In pull device 272, the S-D paths of N-FETs 222 and 212 are serially coupled between second reference line 92 and node 122. The gate of N-FET 222 is coupled to input terminal 95 for receiving X and the gate of N-FET 212 is coupled to line 131 for receiving $Q_1$. The means for pulling nodes (devices 272 and 274) is coupled to the second level.

Point 152 at the source of P-FET 282 and point 154 at the source of P-FET 284 are introduced. In hold device 294, the D-S paths of P-FET 234 and of P-FET 244 are coupled between the source of P-FET 284 (point 154) and first reference line 91. The gate of P-FET 244 is coupled to input terminal 95 for receiving X. The gate of P-FET 234 is coupled to line 133 for receiving $Q_3$. In hold device 292, the D-S paths of P-FET 232 and P-FET 242 are coupled between the source of P-FET 282 (point 152) and first reference line 91. The gate of P-FET 242 is coupled to input terminal 95 for receiving X. The gate of P-FET 232 is coupled to line 131 for receiving $Q_1$.

Second portion 20 is structural similar to first portion 10. In portion 10 and portion 20, FETs 211/213, 212/214, 221/223, 222/224, 231/233, 232/234, 241/243, 242/244, 281/283, and 282/284 are corresponding. The terms 'conductive, not conductive' are used, for example, in connection with devices 271, 272, 273, 274, 291, 292, 293, and 294 or with the S-D paths of the FETs. This terms should be interpreted in the broadest sense. It is only important that a, for example, conducting element (e.g., a FET) changes the state of other elements. Logical "1" signals at the gates make N-FETs conductive and make P-FETs non conductive. Logical "0" signals at the gates make N-FETs non conductive and make N-FETs conductive.

Pull devices 271 and 273 (P-FETs in series) are conductive for (X="0" AND $Q_4$="0") and (X="0" and $Q_2$="0"), respectively. 'X="0"' symbolizes that the input signal is at the second level. The operator 'AND' symbolizes the conjunctive function. When conductive, first pull device 271 and third pull device 273 pull signals $Q_1$ and $Q_3$ at nodes 121, 23, respectively, to logical "1" (first level). When pull devices 271 or 273 are not conductive, nodes 121, 123 are floating. Pull devices 272 and 274 (N-FETs in series) are conductive for (X="1" AND $Q_1$="1") and (X="1" and $Q_3$="1"), respectively. 'X="1"' symbolizes that the input signal is at the first level. When conductive, pull devices 272 and 274 pull signals $Q_2$ and $Q_4$ at nodes 23, 24, respectively, to logical "0". Hold devices 292 and 294 (parallel P-FETs) are conductive for (X="0" OR $Q_1$="0") and (X="0" OR $Q_3$="0"), respectively. When conductive, hold devices 292 and 294 hold points 152, 154, respectively up at logical "1". The operator 'OR' symbolizes the disjunctive function. Hold devices 291, 293 (parallel N-FETs) are conductive for (X="1" OR $Q_4$="1") and (X="1" OR $Q_2$="1"), respectively. When conductive, hold devices 291 and 293 hold points 151, 153, respectively, down at logical "0".

Flip-flop 51 toggles when the drains of either N-FET 281 (at node 121) or N-FET 283 (at node 123) is pulled to logical "1". Flip-flop 52 toggles when the drain of either P-FET 284 (at node 123) or P-FET 282 (at node 122) is pulled to logical "0".

Preferably, in portion 10, the current carrying capacity of P-FETs 211, 213, 221, and 223 of pull devices 271 and 273 is larger than the current carrying capacity of N-FETs 281 and 283 of flip-flop 51. Preferably, in portion 20, the current carrying capacity of N-FETs 212, 214, 222, and 224 of pull devices 272 and 274 is larger than the current carrying capacity of P-FETs 282 and 284 of flip-flop 52. A person of skill in the art is able to accomplished this by, for example, appropriate selection of the transistor dimensions.

Tables 1, 2 and 3 shows by way of example the method of the invention as performed by frequency divider 50 in the preferred embodiment of FIG. 4. In the tables, columns show steps 1–4 (all tables), and rows show signals $Q_I$ at nodes 12I (table 1), points 15I (table 2) and the FETs of the flip-flops (table 3).

Each of the 16 fields located at the corresponding place in tables 1–3 illustrates operations or states at the same time. In other words, one event can be described by the entries of the corresponding fields of the tables. For example, in tables 1 through 3, the events or states indicated in the field [1;1] are substantially co-incident in time. The same is true for the other fields [p;q] where p indicates a row and q indicates a column of the table.

In table 1, the term 'to' gives the toggle directions of intermediate signals $Q_1$, $Q_2$, $Q_3$ and $Q_4$. The word 'by' illustrates that the signals toggle either when pulled to a reference line by pull devices ("pull 271, 272, 273, 274") or when a flip-flop changes ("FF 51, 52"). For simplicity, empty fields in table 1 indicate that a signal does not toggle.

TABLE 1 toggling of $Q_1$–$Q_4$ to "1" or "0" during steps 1–4
(for $Q_I$ by pull devices 271–274 (pull) or by flip-flops (FF) 51, 52

| q | | 1 | 2 | 3 | 4 |
|---|---|---|---|---|---|
| p | | step 1 (X to "0") | step 2 (X to "1") | step 3 (X to "0") | step 4 (X to "1") |
| 1 | $Q_1$ | # | | | |
|   | to | 1 | | "0" | |
|   | by | pull 271 # | | FF 51 | |
| 2 | $Q_2$ | | # | | |
|   | to | | "0" | | "1" |
|   | by | | pull 272 # | | FF 52 |
| 3 | $Q_3$ | | | # | |
|   | to | "0" | | "1" | |
|   | by | FF 51 | | pull 273 # | |
| 4 | $Q_4$ | | | | # |
|   | to | | "1" | | "0" |
|   | by | | FF 52 | | pull 274 # |

In tables 1–2, there is an imagined diagonal line from field [1;1] to field [4;4] illustrating the preferred signal flow. For convenience, in tables 1–2 the line is indicated by #-symbols. Alongside the line in table 1, signals are pulled alternatively to "1" and to "0" and become active signals. For example, in step 1, in first portion 10, $Q_1$ is pulled to "1" and is supplied to second pull device 272 of second portion 20. When in step 2, X goes also to "1", serially coupled N-FETs 212 and 222 of second pull device 272 become conductive and pull $Q_2$ to "0". Generally, pull device 27I provides active signal $Q_I$ in step I. When in step I+1, X goes to the same logical level as $Q_I$, then pull device 27I+1 provides active signal $Q_{I+1}$ and so on.

Also, it can be seen that in four steps, X toggles four times (2*N), while any $Q_I$ alternates only two times (division ratio N=2). During steps 1 and 3, that means when X falls to "0", first portion 10 is enabled and pull devices 271, 273 and flip-flop 51 operate (cf. rule (2)). During steps 2 and 4, when X rises to "1", the elements of second portion 20 operate (rule (1), pull devices 272, 274, flip-flop 52). According to rules (3a) and (3b), after signal $Q_I$ is pulled to "1" or "0", signal $Q_{I+1}$ toggles. As a person of skill in the art will understand, table 1 can be enlarged for higher division ratios N by adding rows for signals $Q_I$ and columns for steps.

As in table 2, points 151, 152, 153, 154 are either released by hold devices 291, 292, 293, and 294 or hold to a reference line (logical "0" or "1") by one of the transistors of the hold devices. As far as hold devices 29I and pull devices 27I are controlled by the same intermediate signals $Q_{I-1}$, the fields of tables 1 and 2 can be compared.

TABLE 2 toggling of points 151, 152, 153, 153 to "1" or "0" during steps 1–4

| q | | 1 | 2 | 3 | 4 |
|---|---|---|---|---|---|
| p | | step 1 (X to "0") | step 2 (X to "1") | step 3 (X to "0") | step 4 (X to "1") |
| 1 | point 151 | # | | | |
| | to | released | "0" | "0" | "0" |
| | by | hold 291 # | N-FET 241 | N-FET 231 | N-FET 241 |
| 2 | point 152 | | # | | |
| | to | "1" | released | "1" | "1" |
| | by | P-FET 242 | hold 292 # | P-FET 242 | P-FET 232 |
| 3 | point 153 | | | # | |
| | to | "0" | "0" | released | "0" |
| | by | N-FET 233 | N-FET 243 | hold 293 # | N-FET 243 |
| 4 | point 154 | | | | # |
| | to | "1" | "1" | "1" | released |
| | by | P-FET 244 | P-FET 234 | P-FET 244 | hold 294 # |

In table 2, alongside the imagined diagonal line (#-symbols) from field [1;1] to [4;4], points 15I are released by nonconducting hold devices 29I. Outside this line, points 15I are hold to reference lines 91 ("1") or 92 ("0") alternatively by different transistors of the hold devices.

Signals $Q_I$ and points 15I reflect the logical functions of pull devices 27I and hold devices 29I, respectively. As it can be seen, conjunctive function ("AND") of pull devices 27I have their complement in the disjunctive function ("OR") of hold devices 29I. When pull device 27I pull nodes 12I with signals $Q_I$, then hold device 29I releases points 15I.

In table 3, transistors 28I (located between nodes 12I and points 15I) are discussed. The term 'switches ON' means that transistor 28I becomes conductive, 'switches OFF' means the opposite. During one step I, at first, FET 28I+2 is switched ON when $Q_I$ toggles (see rule 3(a)) and at second, FET 28I is switched OFF and FET 28I+2 is switched ON (rule 3(b)).

TABLE 3 conduction of transistors during steps 1–4

| q | | 1 | 2 | 3 | 4 |
|---|---|---|---|---|---|
| p | | step 1 (X to "0") | step 2 (X to "1") | step 3 (X to "0") | step 4 (X to "1") |
| 1 | N-FET 281 | | | | |
| | switches | OFF | | ON | |
| | by | $Q_3$ to "0" | | $Q_3$ to "1" | |
| 2 | P-FET 282 | | | | |
| | switches | | OFF | | ON |
| | by | | $Q_4$ to "1" | | $Q_4$ to "0" |
| 3 | N-FET 283 | | | | |
| | switches | ON | | OFF | |
| | by | $Q_1$ to "1" | | $Q_1$ to "0" | |

TABLE 3-continued conduction of transistors during steps 1–4

| q | | 1 | 2 | 3 | 4 |
|---|---|---|---|---|---|
| 4 | P-FET 284 | | | | |
| | switches | | ON | | OFF |
| | by | | $Q_2$ to "0" | | $Q_2$ to "1" |

The method of the present invention is explained with more details for step 1. At state A (FIG. 3), it is supposed that X="1". Therefore, N-FETs 222, 224, 241, and 243, are conductive and P-FETs 221, 223, 242, and 244 are not conductive. Intermediate signals are $Q_1$="0", $Q_2$="1", $Q_3$="1", and $Q_4$="0". In flip-flop 51, N-FET 281 is conductive and N-FET 283 is not conductive. In flip-flop 52, P-FET 282 is conductive and P-FET 284 is not conductive.

In step 1, X falls to logical "0". P-FETs 221, 223, 242, and 244 become conductive and N-FETs 222, 224, 241, and 243 become non-conductive. In first portion 10, active signal $Q_4$="0" renders P-FET 211 of first pull device 271 conductive. At this moment, N-FET 281 of flip-flop 51 is still conductive. If point 151 would be directly connected to second reference line 92, N-FET 281 would hold down node 121 and P-FETs 221 and 211 would pull up node 121. Such a situation when transistors pull a node in different directions is known in the art as contention. P-FETs 221 and 211 would have to override N-FET 281. However, N-FETs 231 and 241 of hold device 291 receive the same signals ($Q_4$ and X at "0") as P-FETs 211 and 221, respectively, of pull device 271. Therefore, hold device 291 is not conducting and point 151 is floating. Node 121 with signal $Q_1$ is pulled to $Q_1$="1" without substantially contention. Conductive N-FET 233 of hold device 293 holds point 153 down to second reference line 92. Point 153 becomes a stable reference point for flip-flop 51. When node 121 reaches logical "1" ($Q_1$="1"), N-FET 283 becomes conductive. Flip-flop 51 flips and signal $Q_3$ goes to "0". Conductive N-FET 283 of flip-flop 51 and conductive N-FET 233 of hold device 293 hold $Q_3$ at logical "0". $Q_3$ toggles after $Q_1$ has toggled. The toggling of $Q_3$ is caused by the toggling of $Q_1$. Signal $Q_4$ (at input $IN_1$=node 111) is negated by pull-device 131 to signal $Q_1$. In second portion 20, flip-flop 52 does not flip. $Q_1$="1" becomes the active signal for the next step. In the following steps, contention is avoided in the same way.

Pull devices and hold devices form pairs (271/291, 272/292, 273/293, 274/294). The devices of each pair simultaneously receive signals in inverted form. The pull device and the hold device of each pairs comprise complementary components. When in a pair a pull device conducts and pulls a node to a reference line, the hold device does not conduct and releases the node. Also, there are hold devices which are diagonally coupled to the nodes. The diagonally coupled hold devices provide reference points for latching means (e.g., flip-flop 51, 52). As in FIG. 4, in flip-flop 51, point 151 is the reference point when $Q_3$ toggles to $Q_3$="1", and point 153 is the reference point when $Q_1$ toggles to $Q_1$="1". In flip-flop 52, point 154 is the reference point when $Q_2$ toggles to $Q_2$="0", and point 152 is the reference point for $Q_4$ toggling to $Q_4$="0".

For example, during step 1, node 121 is pulled up to first reference line 91 and point 153 goes down to second reference line 92 at the same time. Node 121 and point 153 are moving in opposite directions. The potential of node 121 changes at a first rate ($dV_{N1}/dt$) and the potential of point 153 changes at a second rate ($dV_{P3}/dt$). The amount of first and second rates are added to a high relative rate. The potential difference between node 121 and point 153 is the gate-source voltage of N-FET 283. This gate-source voltage is the control voltage causing flip-flop 51 to toggle. Having first and second rates added flip-flop 51 toggles fast.

In general, the latching means (e.g., flip-flops 51, 52) are controlled by control voltages between nodes 12I and reference points 15I+2. Reference points 15I+2 are not directly connected to the reference lines (91 and 92). Nodes 12I have a potential $V_{NI}$ changing at the first rate $dV_{NI}/dt$. Reference points 15I+2 have a potential $V_{PI+2}$ changing at the second rate $dV_{PI+2}/dt$. First rate $dV_{NI}/dt$ and second rate $dV_{PI+2}/dt$ have opposite signs. The magnitude of the rates are added: $|dV_{NI}/dt|+|dV_{PI+2}/dt|$. Hold devices 29I (e.g., 291, 292, 293, 294) move reference points 15I+2 in an opposite direction as pull devices move nodes 12I (e.g., 121, 122, 123, 124). Thereby, the control voltage between node and reference point is changed quickly so that a high speed operation of frequency divider 50 can be achieved.

The method according to the invention can be explained in other words. The frequency $f_X$ of binary input signal X is divided to the lower frequency $f_Y$ ($f_Y=f_X/2$) of binary output signal Y by the following cyclical steps:

(1) First line 131 is pulled to the first level by first pull device 271 when binary input signal X is at the second level and when fourth line 134 is at second level. First line 131 is latched by first flip-flop 51 and third line 133 is made floating.

(2) Second line 132 is pulled to the second level by second pull device 272 when binary input signal X is at the first level and when first line 131 is at the first level. Second line 132 is latched by second flip-flop 52 and fourth line 133 is made floating.

(3) Third line 133 is pulled to said first level by third pull device 273 when binary input signal X is at the second level and when second line 132 is at the second level. Third line 133 is latched by first flip-flop 51 and first line 131 is made floating.

(4) Fourth line 134 is pulled to the second level by fourth pull device 274 when binary input signal X is at the first level and when first line 131 is at first level.

Fourth line 134 is latched by second flip-flop 52 and second line 132 is made floating. Binary output signal Y is available at any of said first, second, third or fourth lines.

Figure 5:
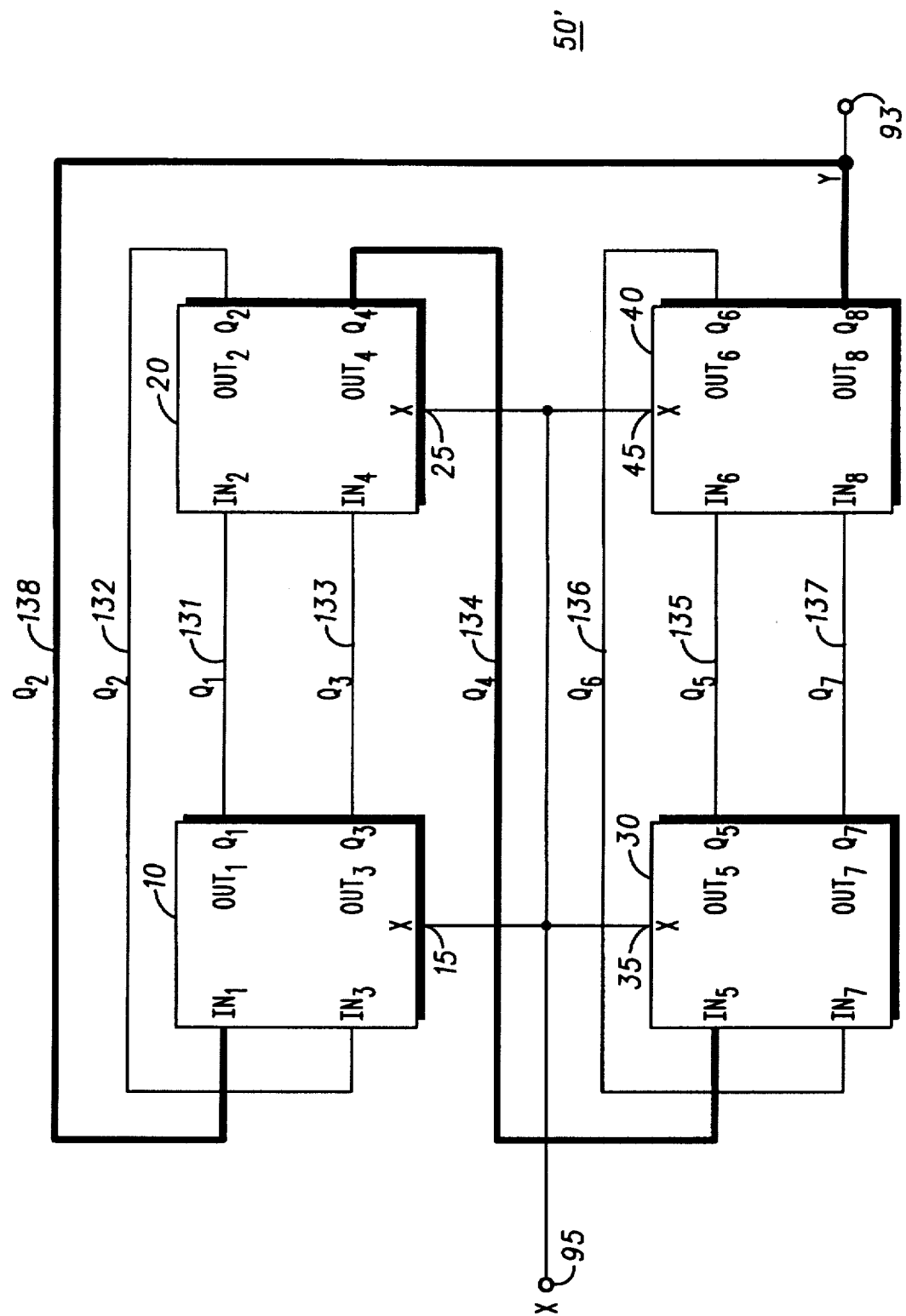
FIG. 5 shows a simplified block diagram of a frequency divider for a division ratio N=4 according to the present invention.

Those skilled in the art will apply apparatus and method of the present invention to other division ratios. Therefore, elements, such as lines, pull devices, and flip-flops can be added. FIG. 5 shows by way of a non-limiting example, a simplified block diagram of frequency divider 50' for a division ratio N=4. Frequency divider 50' is a variation of frequency divider 50 of FIG. 2 and further comprises portions 30 and 40, lines 135, 136, 137, and 138. Control inputs 35 and 45 of portions 30 and 40 are coupled to input terminal 95 for receiving non-inverted signal X. Additional intermediate signals are $Q_5$, $Q_6$, $Q_7$, and $Q_8$. Additional portions 30, 40 have inputs $IN_5$ to $IN_8$ and outputs $OUT_5$ to $OUT_8$. Preferably, portions 10 and 30 as wells as portions 20 and 40 have a similar structure. $IN_5$ of portion 30 is coupled to $OUT_4$ of portion 20 by line 134 (shown bold) and $OUT_8$ of portion 40 is coupled to $IN_1$ of portion 10 by line 138 (shown bold). Lines 135 to 137 couple portions 30 and 40 accordingly as it has been explained for lines 131 to 133 between portions 10 and 20. As in FIG. 5, output terminal 93 (signal Y) is coupled to $OUT_8$. As it has been explained above in connection with FIG. 2, output terminal can also be coupled to any other outputs $OUT_j$.

Frequency divider 50 as a preferred embodiment of the invention has been introduced and explained in reference to rectangular signals. The portions are assumed to be edge triggered with falling and rising input signal X. However, the shape of the signals is not important for the invention. Signals can be ramps, sinusoidal or others. The portions can also be level triggered. Frequency divider 50 also operates for X which does not have a full rail-to-rail swing between reference lines 91 and 92.

As mentioned above in connection with FIG. 5, higher order frequency dividers for division ratios N>2 can be derived without departing from the scope of the present invention. The above mentioned structural similarity of portions 10 and 20 and possible modifications for N>2 can be further illustrated when frequency divider 50 is considered as a plurality of M serial arrangements (I=1 . . . M). In the non-limiting example of FIG. 4 for N=2 and M=2*N=4, these serial arrangements are pull devices 271, 272, 273, and 274 (in general 271) of FIG. 4. Preferably, M is an even number and has at least a value of M=4. Arrangement 271 has serially coupled a first switch 21I (e.g., FET 211) and a second switch 22I (e.g., FET 22I). Odd arrangements 27O (e.g., 271 and 273) are coupled between odd nodes 12O (e.g., 121 and 123) and first reference line 91. Conductive odd first switches 21O and odd second switches 22O provide odd intermediate signals $Q_O$ (e.g., $Q_1$ and $Q_3$) at first level (e.g., logical "1"). Even arrangements 27E (e.g., 272 and 234) are coupled between even nodes 12E (e.g., 122 and 124) and second reference line 92. Conductive even first switches 21E and even second switches 22E provide even intermediate signals $Q_E$ (e.g., $Q_2$ and $Q_4$) at second level (e.g., logical "0"). Second switches 22I (e.g., FETs 221, 222, 223, 224) in even and odd arrangements receive input signal X at their control electrodes (e.g., gates). The input signal X is the same at, preferably, all M control electrodes. The input signal X is binary and alternates between the first level (e.g., logical "1") and the second level (e.g., logical "0"). Intermediate signal $Q_M$ at node 12M of arrangement 17M (e.g., node 224) controls the first switch (e.g., N-FET 211) of first arrangement 271. Intermediate signals $Q_I$ of arrangements 271 to 27M control first switch 22I+1 of neighboring arrangement 27I+1. Controlling neighboring switches is convenient, but not essential for the invention. It is convenient to have switches of a first type (e.g., N-FETs) in even arrangements (e.g., 272 and 274). This first-type switches conduct when the control electrode (e.g., gate) is at the first level (e.g., logical "1"). It is convenient to have switches of a second, opposite type (e.g., P-FETs) in odd arrangements (e.g., 272 and 274). This second-type switches conduct when the control electrode (e.g., gate) is at the second level (e.g., logical "0").

Intermediate signals $Q_I$ are cyclically transferred through frequency divider 50. The frequency by which intermediate signals $Q_I$ change is smaller than the frequency of input signal X, so that any of intermediate signal $Q_I$ can be used as binary output signal Y. Having, as in the example of FIG. 4, a plurality of M=4=2*N (* for multiplication), the frequency divider divides $f_x$ to $f_y=f_x/2$.

Latching means (e.g., flip-flops 51 and 52) are coupled among even arrangements 27E and coupled among odd arrangements 27O. Preferably, the flip-flops are coupled between node 12I and 12I+2. It is convenient, that latching means between even arrangements 27E are implemented by switches of the second type (e.g., N-FETs 281, 283) and that latching means between odd arrangements 27O (e.g., flip-flop 52) are implemented by switches of the first type (e.g., P-FETs 284, 282). In other words, latching means between arrangements having switches of one type are, preferably, implemented by switches of the opposite type.

Hold devices 19I comprise parallel arranged third switches (e.g., FETs 23I) and fourth switches (e.g., FETs 24I). As described by the term 'associated', parallel switches 23I and 24I are coupled to arrangements 17I via nodes 12I.

Even third switches (e.g., P-FETs 232, 234) are coupled between even arrangements (e.g., at nodes 122, 124) and first reference line 91. Odd third switches (e.g., N-FETs 231, 233) are coupled between odd arrangements (e.g., at nodes 121, 123) and second reference line 92. Third switches 23I receive the same intermediate signals as the associated serial arrangements 27I. For example, N-FET 231 and P-FET 211 receive $Q_4$. Third switches 23I (e.g., N-FET 231) are switched on (conductive) when first switch 21I (e.g., P-FET 211) of associated arrangement 27I (e.g., 271) is switched off by an intermediate signal (e.g., $C_4$).

Even fourth switches 24E (e.g., P-FETs 242, 244) are coupled between even arrangements 27E (e.g., 272, 234) and first reference line 91 and odd fourth switches 24O (e.g., N-FETs 243, 241) are coupled between odd arrangements 27O (e.g., 271, 273) and second reference line 92. Fourth switches 24I (e.g., N-FET 241) receive binary input signal X (at e.g., the gates) and are conductive when second switches 22I (e.g., P-FET 221) of arrangements 17I are non conductive. Preferably, the third switches 23I and fourth switches 24I are of an opposite type as the first and second switches of the associated arrangement.

As a person of skill in the art will understand, frequency divider can be further simplified. Some or all even second switches 22E and some or all odd second switches 22O can be combined by coupling them in parallel so that some second switches can be left out. For example in FIG. 4, the drain of P-FET 221 can be coupled to the source of P-FET 213 and P-FET 223 can be left out. Also, second switches 22I and fourth switches 24I which are coupled to the same reference line can be switched in parallel so that some switches can be left out.

Figure 6:
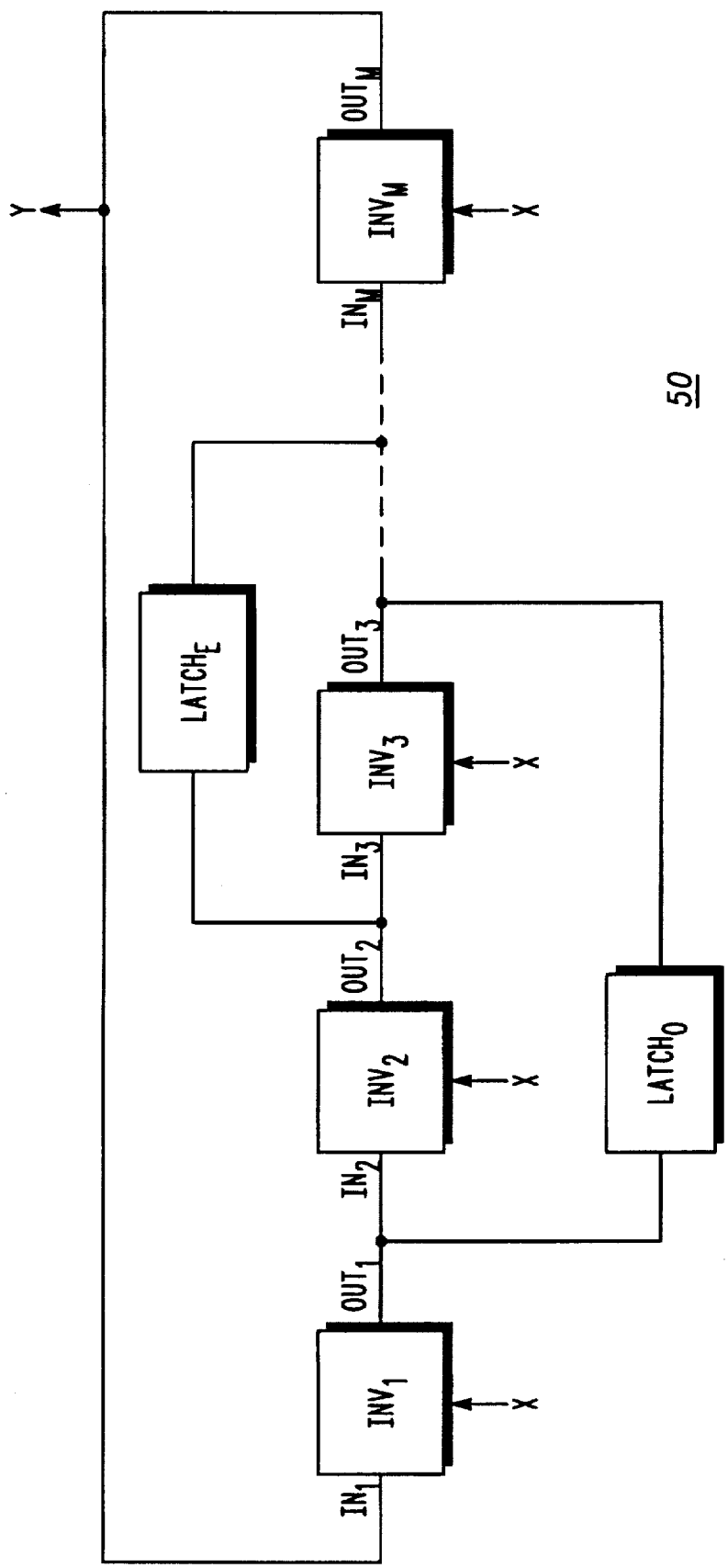
FIG. 6 shows a further schematic block diagram of the frequency divider according to the invention.

FIG. 6 shows a further simplified block diagram of frequency divider 50. Frequency divider 50 of the invention can also be considered as a plurality of M inverters $INV_I$ (I=1 to I=M) having inputs $IN_I$ and outputs $OUT_I$. Inverters $INV_I$ are arranged by inputs $IN_I$ and $OUT_I$ in an end-around coupled chain. That means, that $OUT_M$ is coupled to $IN_1$. Inverter $INV_I$ simultaneously receive binary input signal X in non-inverted form at a control input (e.g., 15, 25 in FIG. 2). Output signal Y can be obtained at any outputs $OUT_I$. Even inverters $INV_E$ operate when X changes in a first direction (e.g., from "1" to "0") and odd inverters $INV_O$ operate when X changes in a second, opposite direction. The term 'operate' is intended to include that X enables the inverters so that a signal at $IN_{I-1}$ is negated to $OUT_I$. Latching means $LATCH_O$ (e.g., flip-flop 51 in FIG. 4) are coupled between $OUT_O$ of odd inverters $INV_O$. Latching means $LATCH_E$ are coupled between outputs $OUT_E$ of even inverters $INV_E$. Preferably, latching means are coupled between $OUT_I$ and $OUT_{I+2}$. Latching means have two tasks: (1) to keep outputs $OUT_I$ stable when $INV_{I+1}$ operates and (2) to turn outputs $OUT_{I+K}$ (K at least K=2) into that logical state that $INV_{I+K-1}$ can change it. Preferably, even inverters $INV_E$ comprise serially arranged transistors of a first type (e.g., N-FETs) and parallel arranged transistors of a second type (e.g., P-FET). Preferably, odd inverters $INV_O$ comprises transistors of the opposite type, i.e., serially arranged transistors of the second type and parallel arranged transistors of the first type.

As it been explained in details, frequency divider 50 according to the present invention has a number of advantages, such as for example, the accommodation of a non-inverted input signal, the possibility to extend it to obtain higher division ratios, the reduction of contention, and short signal paths.

The above description is intended by way of example only and is not intended to limit the present invention in any way except as set forth in the following claims.

We claim:

1. An apparatus receiving an input signal alternating between a first level and a second level at an input frequency, said apparatus comprising:

a first node, a second node, a third node, and a fourth node, said first node and said third node belonging to a first portion, said second node and said fourth node belonging to a second portion, said first portion receiving said input signal, said first portion having switchable means of a first type receiving said input signal for pulling said first node and said third node of said first portion alternatively to said first level in response to changes of said input signal and having means for keeping said first and third nodes temporarily at said first level, said second portion receiving the same input signal as said first portion and not receiving an inverted input signal, said second portion having switchable means of a second, opposite type receiving the same input signal for pulling said second node and said fourth node of said second portion to said second level in response to changes of the same input signal and having means for keeping said second and fourth nodes temporarily at said second level;

whereby said first portion is coupled to said second portion for monitoring said second node and said fourth node, whereby said second portion is coupled to said first portion for monitoring said first node and said third node, and whereby said switchable means for pulling said first and third nodes are made responsive by said input signal when said input signal goes to said second level and said switchable means for pulling said second and fourth nodes are made responsive by said input signal when said input signal goes to said first level, so that said first, second, third, and fourth nodes alternate between said first and said second levels at half the frequency of the input signal, thus providing an output signal at half the input frequency.

2. An apparatus receiving an input signal alternating between a first level and a second level at an input frequency, said apparatus comprising:

a first node, a second node, a third node, and a fourth node, said first node and said third node belonging to a first portion, said second node and said fourth node belonging to a second portion, said first portion receiving said input signal, said first portion having means for pulling said first node and said third node of said first portion alternatively to said first level in response to changes of said input signal and having means for keeping said first and third nodes temporarily at said first level, said means for pulling said first node and said third node formed by a first, a second, a third, and a fourth transistor of a first type, said second portion receiving the same input signal as said first portion, said second portion having means for pulling said second node and said fourth node of said second portion to said second level in response to changes of said input signal and having means for keeping said second and fourth nodes temporarily at said second level, said means for pulling said second node and said fourth node to said second level formed by a first, a second, a third, and a fourth transistor of a second type, said second type being a complementary type to said first type;

whereby said first portion is coupled to said second portion for monitoring said second node and said fourth node, whereby said second portion is coupled to said first portion for monitoring said first node and said third node, and whereby said means for pulling said first and third nodes are responsive when said input signal goes to said second level and said means for pulling said second and fourth nodes are responsive when said input signal goes to said first level, so that said first, second, third, and fourth nodes alternate between said first and said second levels at a lower rate than the input signal, thus providing an output signal at an output frequency lower than said input frequency.

3. An apparatus receiving an input signal alternating between a first level and a second level at an input frequency, said apparatus comprising:

a first node, a second node, a third node, and a fourth node, said first node and said third node belonging to a first portion, said second node and said fourth node belonging to a second portion, said first portion receiving said input signal, said first portion having means for pulling said first node and said third node of said first portion alternatively to said first level in response to changes of said input signal and having means for keeping said first and third nodes temporarily at said first level, said means for pulling said first node and said third node formed by a first, a second, a third, and a fourth transistor of a first type, said first transistor and said second transistor being serially coupled between said first node and a first reference line, said third transistor and said fourth transistor being serially coupled between said third node and said first reference line, said second portion receiving the same input signal as said first portion, said second portion having means for pulling said second node and said fourth node of said second portion to said second level in response to changes of said input signal and having means for keeping said second and fourth nodes temporarily at said second level, said means for pulling said second node and said fourth node to said second level formed by a first, a second, a third, and a fourth transistor of a second type, said first transistor and said second transistor being serially coupled between said third node and a second reference line, said third transistor and said fourth transistor being serially coupled between said fourth node and said second reference line, whereby said means for pulling said first and third nodes are responsive when said input signal goes to said second level and said means for pulling said second and fourth nodes are responsive when said input signal goes to said first level, wherein said first transistors and said third transistors of said first portion and of said second portion are controlled by said input signal, whereby said first portion is coupled to said second portion for monitoring said second node and said fourth node, said second transistor of said first portion controlled by said fourth node of said second portion, said fourth transistor of said first portion controlled by said second node of said second portion, whereby said second portion is coupled to said first portion for monitoring said first node and said third node, said second transistor of said second portion controlled by said first node of said first portion and said fourth transistor of said second portion controlled by said third node of said first portion, so that said first, second, third, and fourth nodes alternate between said first and said second levels at a lower rate than the input signal, thus providing an output signal at an output frequency lower than said input frequency.

4. A method for operating an apparatus receiving an input signal alternating between a first level and a second level at an input frequency, said method comprising the steps of:

supplying said input signal to switchable pulling means of a first type belonging to a first portion, thereby pulling a first node and a third node of said first portion alternatively to said first level in response to changes of said input signal, and keeping said nodes temporarily at said first level;

supplying the same input signal to switchable pulling means of a second, opposite type belonging to a second portion without inverting said input signal, thereby pulling a third node and a fourth node of said second portion to said second level in response to changes of said uninverted input signal and keeping said nodes temporarily at said second level;

monitoring said first and third nodes of said first portion by said second portion and monitoring said second and fourth nodes of said second portion by said first portion, and pulling said first and third nodes of said first portion only when said input signal goes to said second level and pulling said second and fourth node of said second portion only when said input signal goes to said first level, so that said first, second, third and fourth nodes alternate between said first and said second levels at half the rate of the input signal, thus providing an output signal at half the frequency of said input frequency.

5. An apparatus comprising:

a first node, a second node, a third node, and a fourth node, said first and third nodes belonging to a first portion, said second and fourth nodes belonging to a second portion, said first portion having a first transistor, a second transistor, a third transistor, and a fourth transistor, said transistors being of a first type, said third transistor and said first transistor being serially coupled between a first reference line and said first node, said fourth transistor and said second transistor being coupled between said first reference line and said third node;

said second portion having a first transistor, a second transistor, a third transistor, and a fourth transistor, said transistors being of a second type which is the complementary type to said first type, said fourth transistor and said second transistor being serially coupled between a second reference line and said second node, said third transistor and said first transistor being serially coupled between said second reference line and said fourth node;

wherein said third transistors and said fourth transistors of said first portion and of said second portion are controlled by an identical binary input signal, said first transistor and said second transistor of said first portion are controlled by said fourth node and said second node, respectively, of said second portion, and said first transistor and second transistor of said second portion are controlled by said third node and said first node, respectively, of said first portion, wherein a binary output signal is available at either of said nodes, said binary output signal is alternating at a lower frequency than said input signal.

6. The apparatus of claim 5 wherein said first portion comprises a first RS-type flip-flop coupled between said first node and said third node and wherein said second portion comprises a second RS-type flip-flop coupled between said third node and said fourth node.

7. The apparatus of claim 5 wherein said transistors of said first type are P-channel field effect transistors and wherein said transistors of said second type are N-channel field effect transistors.

8. An apparatus receiving a single input signal X alternating between a first logical state and a second logical state in a first transition and alternating between said second logical state and said first logical state in a second transition, said apparatus comprising:

a first portion receiving said input signal X and providing a first signal $Q_1$ and a third signal $Q_3$;

a second portion receiving said input signal X and supplying a second signal $Q_2$ and a fourth signal $Q_4$ to said first portion, said second portion receiving said first signal $Q_1$ and said third signal $Q_3$ from said first portion, whereby said signals X, $Q_1$, $Q_2$, $Q_3$, and $Q_4$ can be in said first logical state or in said second logical state, whereby said input signal X has first and second transitions at different times, whereby said first portion has a first switching device of a first type activated by the first transition of X so that when said first portion receives signal $Q_4$ in the second logical state, said first device outputs signal $Q_1$ in a first logical state, whereby said second portion has a second switching device of a second type activated by the second transition of X so that when said second portion receives signal $Q_1$ in said first logical state, said second device outputs signal $Q_2$ in said second logical state, whereby said first portion has a third switching device of the first type activated by the first transition of X so that when said first portion receives $Q_2$ in said second logical state, said third device outputs signal $Q_3$ in said first logical state, whereby said second portion has a fourth switching device of the second type activated by the second transition of X said second portion receives $Q_3$ in said first logical state, said fourth device outputs signal $Q_4$ in said second logical state, and whereby signals $Q_1$, $Q_2$, $Q_3$, and $Q_4$ alternate between said first logical state and said second logical state at half the rate as signal X alternates between said first logical state and said second logical state.

9. A method of dividing the frequency of an input signal X which alternates between a first level and a second level, said method being applied in an apparatus having at least a first line, a second line, a third line, and a fourth line, said method comprising the following cyclical steps:

(1) pulling said first line to said first level by a first pull device of first type elements which conjunctively relates said binary input signal in non-inverted form with the signal present at said fourth line when said binary input signal X is at said second level and when said fourth line is at said second level;

(2) pulling said second line to said second level by a second pull device of second type elements which conjunctively relates said binary input signal in non-inverted form with the signal present at said first line when said binary input signal X is at said first level and when said first line at said first level;

(3) pulling said third line to said first level by a third pull device of first type elements which conjunctively relates said binary input signal in non-inverted form with the signal present at said second line when said binary input signal X is at said second level and when said second line is at said second level;

(4) pulling said fourth line to said second level by a fourth pull device of second type elements which conjunctively relates said binary input signal in non-inverted form with the signal present at said third line when said binary input signal X is at said first level and when said third line is at said first level, wherein a binary output signal Y alternating at a lower frequency than said binary input signal X is available at any of said first, second, third or fourth lines.

10. The method of claim 9 wherein in said step (1) said first line is latched by a first flip-flop and said third line is made floating;

in said step (2) said second line is latched by a second flip-flop of a type opposite to that of said first flip-flop and said fourth line is made floating;

in said step (3) said third line is latched by said first flip-flop and said first line is made floating; and in said step (4) said fourth line is latched by said second flip-flop and said second line is made floating.

11. An apparatus having an input terminal for receiving an input signal X and a first reference line and a second reference line, said first reference line and said second reference line substantially corresponding to a first logical state and to a second logical state of intermediate signals $Q_1$, $Q_2$, $Q_3$, and $Q_4$, respectively, said apparatus comprising:

a first node, a second node, a third node, a fourth node;

a first pull device as alternating signals only receiving X and $Q_4$, said first pull device providing $Q_1$ at said first logical state by pulling said first node to said first reference line for X="0" AND $Q_4$="0";

a second pull device as alternating signals only receiving X and $Q_1$, said second pull device providing $Q_2$ at said second logical state by pulling said second node to said second reference line for X="1" AND $Q_1$="0";

a third pull device as alternating signals only receiving X and $Q_2$, said third pull device providing $Q_3$ at said first logical state by pulling said third node to said first reference line for X="0" AND $Q_2$="0";

a fourth pull device as alternating signals only receiving X and $Q_3$, said fourth pull device providing $Q_4$ at said second logical state by pulling said fourth node to said second reference line for X="1" AND $Q_3$="0";

a first flip-flop coupled to said first node and to said third node for latching signal $Q_1$ at logical "1" and alternatively latching signal $Q_3$ at logical "1"; and a second flip-flop coupled to said second node and to said fourth node for latching signal $Q_2$ at logical "0" and alternatively latching signal $Q_4$ at logical "0"; whereby either one of said intermediate signals $Q_1$, $Q_3$, $Q_2$, or $Q_4$ is supplied to an output terminal.

12. An apparatus for dividing a first frequency of a binary input signal X into a second frequency of an output signal Y, said apparatus comprising:

at least a plurality of M inverters having indices from I=1 to I=M, said inverters being classified by said indices I into even and odd inverters, each inverter having an input and an output, said inverters being arranged by said inputs and outputs in an end around coupled chain, wherein each inverter simultaneously receive said binary input signal in a not inverted form at a control input, wherein said output signal Y can be obtained at any of said outputs of said inverters, wherein said even inverters operate when said binary input signal X changes in a first direction and wherein said odd inverters operate when said binary input signal X changes in a second, opposite direction, and wherein latching means are coupled between said outputs of odd inverters and latching means are coupled between said outputs of said even inverters.

* * * * *